United States Patent
Tao et al.

(10) Patent No.: US 9,576,622 B2
(45) Date of Patent: Feb. 21, 2017

(54) READING DATA FROM A MEMORY CELL

(71) Applicant: TAIWAN SEMICONDUCTOR MANUFACTURING COMPANY, LTD., Hsinchu (TW)

(72) Inventors: Derek C. Tao, Fremont, CA (US); Annie-Li-Keow Lum, San Jose, CA (US); Yukit Tang, San Jose, CA (US); Kuoyuan (Peter) Hsu, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 20 days.

(21) Appl. No.: 14/163,277

(22) Filed: Jan. 24, 2014

(65) Prior Publication Data
US 2015/0213858 A1    Jul. 30, 2015

(51) Int. Cl.
G11C 11/21 (2006.01)
G11C 7/12 (2006.01)
G11C 7/18 (2006.01)
G11C 11/412 (2006.01)
G11C 11/419 (2006.01)

(52) U.S. Cl.
CPC . *G11C 7/12* (2013.01); *G11C 7/18* (2013.01); *G11C 11/412* (2013.01); *G11C 11/419* (2013.01)

(58) Field of Classification Search
CPC .................................. G11C 13/0021
USPC .................................. 365/189.011
See application file for complete search history.

(56) References Cited

U.S. PATENT DOCUMENTS

| | | | |
|---|---|---|---|
| 6,038,193 A | 3/2000 | Wang et al. | |
| 7,894,296 B2 | 2/2011 | Lee et al. | |
| 8,988,954 B2* | 3/2015 | Chong | G11C 11/419 365/189.011 |
| 2006/0203542 A1* | 9/2006 | Kurotsuchi et al. | 365/163 |
| 2006/0268594 A1* | 11/2006 | Toda | 365/100 |
| 2007/0139997 A1 | 6/2007 | Suzuki et al. | |
| 2008/0112212 A1* | 5/2008 | Wang et al. | 365/154 |
| 2008/0137440 A1* | 6/2008 | Liaw | 365/189.04 |
| 2010/0091585 A1* | 4/2010 | Wang | 365/189.011 |
| 2012/0099367 A1* | 4/2012 | Azuma et al. | 365/148 |

OTHER PUBLICATIONS

Office Action dated Feb. 23, 2016 from corresponding No. TW 103145037.

* cited by examiner

*Primary Examiner* — Min Huang
(74) *Attorney, Agent, or Firm* — Hauptman Ham, LLP (57) ABSTRACT

In response to a write operation to a memory cell that causes a data line of the memory cell to have a first voltage direction, causing the data line to have a second voltage direction opposite the first voltage direction.

20 Claims, 6 Drawing Sheets

READING DATA FROM A MEMORY CELL

FIELD

The present disclosure is related to reading data from a memory cell.

BACKGROUND

A two port register file or memory cell includes a write port and a read port. The read port includes a bit line or a data line that carries the data read from the memory cell. In various situations, the data line is kept at a logical high voltage level. In some approaches, a voltage keeper is designed to maintain the logical high voltage level for the data line. A voltage keeper of a local input-output (LIO) of a memory array is called a local voltage keeper to be distinguished from a global voltage keeper in other areas of the memory array. A local voltage keeper that is static has a relatively large channel length, and results in an increased layout area for the LIO having the voltage keeper. A memory design without a local voltage keeper or with a dynamic local voltage keeper, together with a dummy write operation on the write port to the memory cell, disturbs a read operation on the read port.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. Voltage keepers for local read bit lines are not used and disturbs caused by a write operation are reduced and/or eliminated. Compared with other approaches, circuit area is reduced.

Memory Macro

Figure 1:
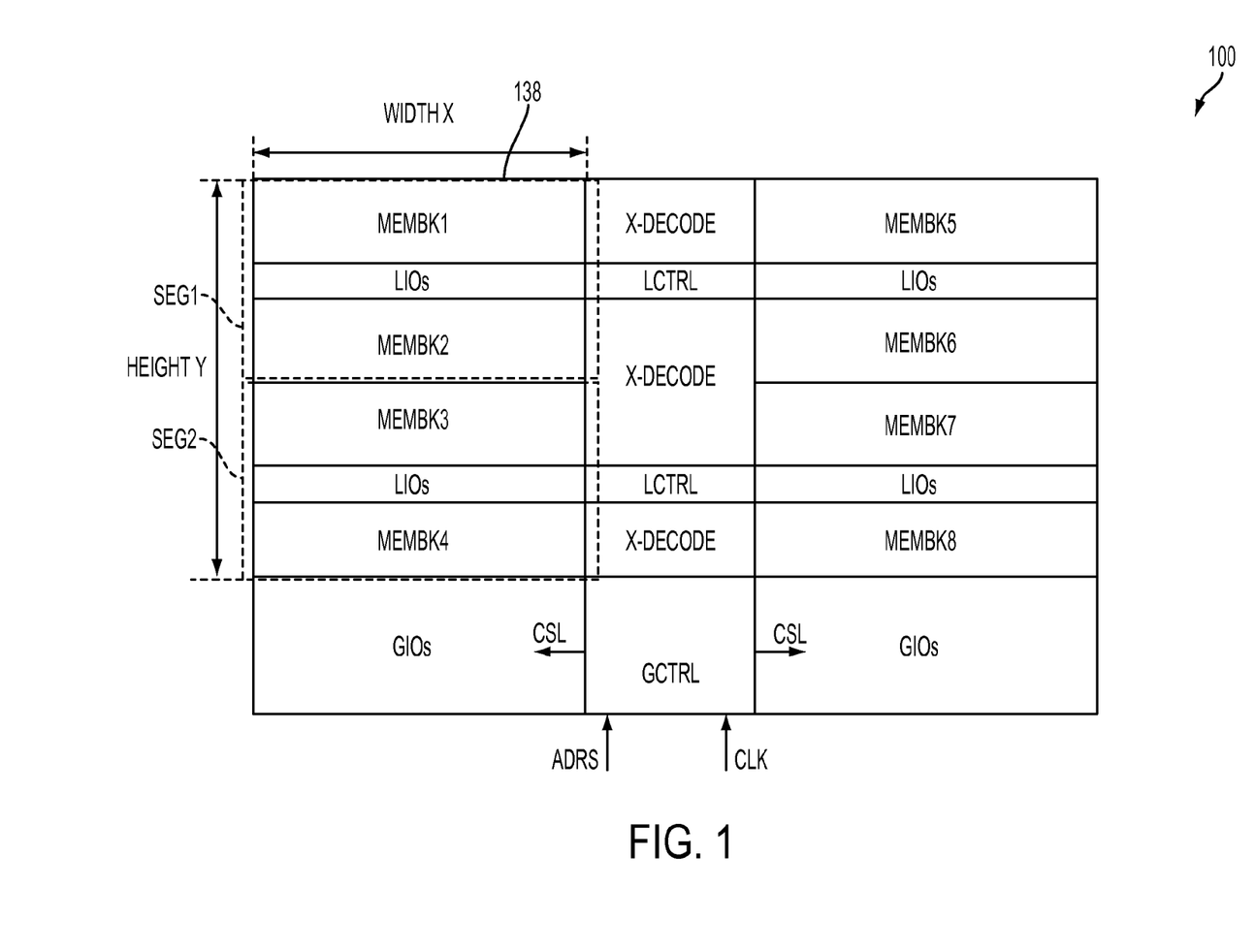
FIG. 1 is a diagram of a memory macro, in accordance with some embodiments.

FIG. 1 is a diagram of a memory macro 100, in accordance with some embodiments. Memory macro 100 is a static random access memory (SRAM) macro, and is used for illustration. Other types of memories are within the scope of various embodiments.

Memory macro 100 is symmetrical. For example, with reference to decoders X-Decode, local control circuits (LC-TRLs), or a global control circuit (GCTRL), circuit elements on the left side of memory macro 100 are similar to circuit elements on the right side of memory macro 100. For another example, memory macro 100 includes two memory arrays. One memory array is on the left side of memory macro 100 and one memory array is on the right side of memory macro 100. For illustration, one memory array on the left side of memory macro 100 is labeled memory array 138 that has a width X and a height Y.

Memory array 138 includes a plurality of memory segments. For illustration, two memory segments SEG1 and SEG2 of memory array 138 are shown. A different number of memory segments is within the scope of various embodiments.

Each memory segment includes two memory banks. For example, memory segment SEG1 includes two memory banks MEMBK1 and MEMBK2, and memory segment SEG2 includes two memory banks MEMBK3 and MEMBK4. For illustration, memory segments SEG1 and SEG2 are indicated in FIG. 1. Memory segments that include memory banks MEMBK5, MEMBK6, MEMBK7, and MEMBK8 are not labeled.

In a memory segment, two memory banks share a row of local input-output circuits LIO. For example, memory bank MEMBK1 and memory bank MEMBK2 share one row of LIOs, memory bank MEMBK3 and memory bank MEMBK4 share one row of LIOs, memory bank MEMBK5 and memory bank MEMBK6 share one row of LIOs, and memory bank MEMBK7 and memory bank MEMBK8 share one row of LIOs.

Memory cells in a memory bank are arranged in rows and columns. As a result, memory cells in a memory segment and in a memory array are also arranged in rows and columns. A memory cell is described with reference to FIG. 2 below, and is labeled MEMCELL. Different configurations of a memory segment are within the scope of various embodiments.

Based on an address ADDRS of a memory cell to be accessed for a read or a write operation, an address decoder X-Decode provides the row-address of the corresponding memory cell to be accessed.

A local control LCTRL controls a corresponding local LIO.

A global input-output circuit GIO serves to transfer data between memory cells in a corresponding memory array and other circuits outside of memory macro 100.

Global control GCTRL provides the row address, the column address pre-decode, clock, and other signals for memory macro 100. Global control GCTRL also controls data transfer between memory cells in the memory array and circuits outside of memory macro 100. For example, global control GCTRL, based on a clock signal CLK and address ADDRS of a memory cell to be read, generates a column select signal CSL to select a column to be pre-charged, to be read, etc.

Figure 6:
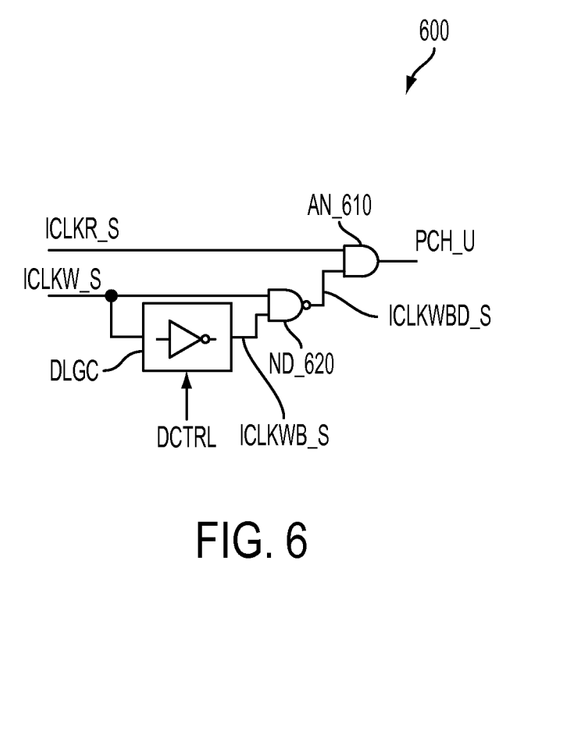
FIG. 6 is a diagram of a circuit generating the signal PCH_U in FIG. 4, in accordance with some embodiments.

In some embodiments, with reference to a read operation of a memory cell in memory macro 100, a read clock signal ICLKR (not labeled) is generated from clock signal CLK. Further, for each segment, such as a segment SEG1 or SEG2, a read clock signal ICLKR_S (not labeled) is generated from read clock signal ICLKR and a read segment decode signal identifying the segment in which a corresponding memory cell is read. Similarly, with reference to a write operation of a memory cell in memory macro 100, a write clock signal ICLKW (not labeled) is generated from clock signal CLK. Further, for each segment, a write clock signal ICLKW_S (not labeled) is generated from write clock signal ICLKW and a write segment decode signal identifying the segment in which a corresponding memory cell is written. Applications of clock signals ICLKR_S and ICLKW_S are illustrated in FIG. 6.

Memory Cell

Figure 2:
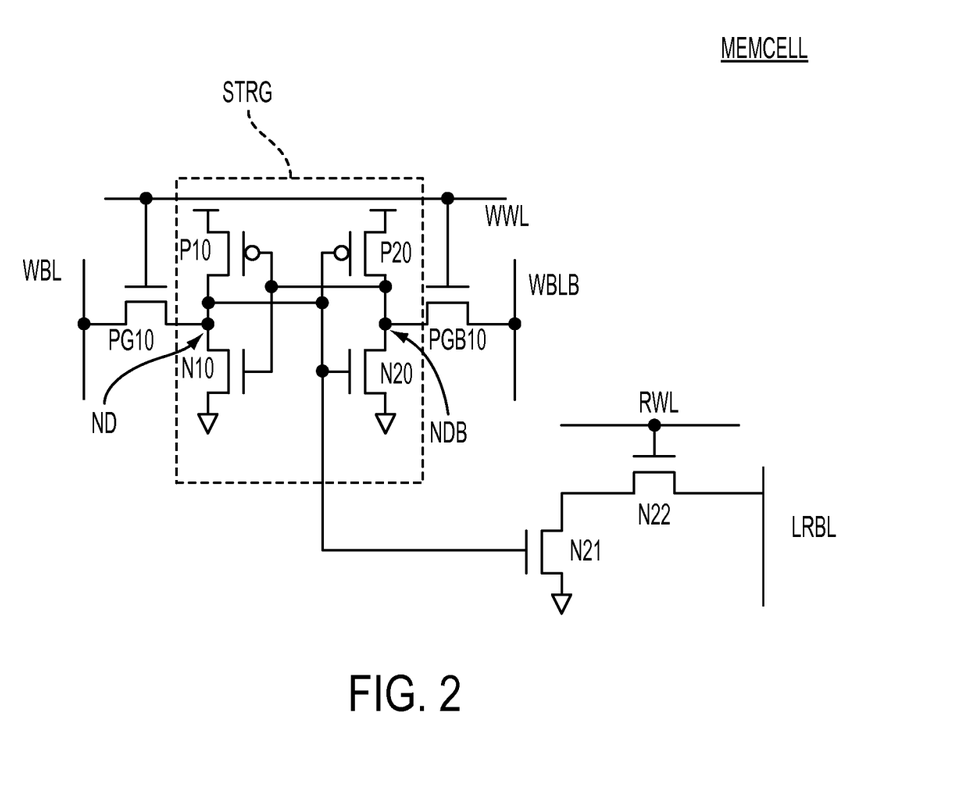
FIG. 2 is a diagram of a memory cell of the memory macro in FIG. 1, in accordance with some embodiments.

FIG. 2 is a diagram of a memory circuit or memory cell MEMCELL, in accordance with some embodiments. Memory cell MEMCELL is also called a two port register file.

Memory cell MEMCELL includes a storage unit STRG, a write port and a read port. The write port includes two N-type transistors PG10 and PGB10, write word line WWL, and write bit lines WBL, WBLB. The read port includes two N-type metal oxide semiconductor (NMOS) transistors N21 and N22, read word line RWL, and read bit line RBL. Read bit line LRBL is also call a local read bit line, which is distinguished from a global read bit line, such as a global read bit line GRBL1 to GRBLM in FIG. 3.

Storage unit STRG includes two P-type metal oxide semiconductor (PMOS) transistors P10, P20, and two N-type metal oxide semiconductor (NMOS) transistors N10, N20. Transistors P10, P20, N10, and N20 form a cross latch or cross-coupled inverters. Transistors P10 and N10 form a first inverter while transistors P20 and N20 form a second inverter. Drains of transistors P10 and N10 are coupled together and form a node ND. Drains of transistors P20 and N20 are coupled together and form a node NDB. Gates of transistors P10 and N10 are coupled together and to drains of transistors P20 and N20. Gates of transistors P20 and N20 are coupled together and to drains of transistors P10 and N10.

Write word line WWL is coupled with a gate of each of transistors PG10 and PGB10 of a plurality of memory cells MEMCELL in a row of memory cells. Write word line WWL is also called a write control line because the signal on write word line WWL controls transistors PG10 and PGB10 for data on write bit lines WBL and WBLB to be written to corresponding nodes ND and NDB.

Each of transistor PG10 and transistor PGB10 is called a pass gate transistor. Drains of transistors PG10 and PGB10 are coupled to the pair of write bit lines WBL and WBLB, respectively. Write bit lines WBL and WBLB are coupled to each drain of transistors PG10 and PGB10 of a plurality of memory cells MEMCELL in a column of a memory array. Each of write bit lines WBL and WBLB is also called a write data line because the data carried on write bit lines WBL and WBLB is written to corresponding nodes ND and NDB.

In a write operation of memory cell MEMCELL, data to be written to memory cell MEMCELL is applied to write bit lines WBL and WBLB. Write word line WWL is then activated to turn on transistors PG10 and PGB10. As a result, the data on bit lines WBL and WBLB is transferred to and is stored in corresponding nodes ND and NDB With respect to the read port, a gate of transistor N21 receives data from storage unit STRG. In the illustrative embodiment in FIG. 2, the gate of transistor N21 receives data from node ND. A source of transistor N21 receives a reference supply voltage, which, in some embodiments, is ground. A drain of transistor N21 is coupled with a source of transistor N22. A gate of transistor N22 is coupled with read word line RWL. A drain of transistor N22 is coupled with read bit line LRBL. In some embodiments, read word line RWL is coupled with each gate of each transistor N22 in a row of memory cells MEMCELL in a memory bank. Further, local read bit line LRBL is coupled with each drain of each transistor N22 in a column of memory cells MEMCELL in a memory bank.

When memory cell MEMCELL is accessed for a read operation, detecting a logical value on read bit line LRBL reveals the logical data stored in memory MEMCELL. For example, in some embodiments, in a read operation, read bit line LRBL is pre-charged with a high logical value. Pre-charge refers to charging before a read or a write operation. Further, read word line RWL is activated with a high logical value. As a result, transistor N22 is turned on. In some embodiments, when storage unit STRG stores a high logical value, storage unit STRG provides a low logical value to the gate of transistor N21. Consequently, transistor N21 is turned off, and transistors N21 and N22 function as an open circuit. Read bit line LRBL therefore remains at the pre-charged high logical value. In other words, the high logical value on read bit line LRBL corresponds to the high logical data stored in storage unit STRG.

In contrast, when storage unit STRG stores a low logical value, storage unit STRG provides a high logical value to the gate of transistor N21. As a result, transistor N21 is turned on. Because transistors N21 and N22 are turned on, read bit line LRBL is pulled to a low logical value at the source transistor N21. Effectively, the low logical value on read bit line LRBL corresponds to the low logical value of the data stored in storage unit STRG.

In some embodiments, reading the data on local read bit line LRBL is by reading the data on a corresponding global read bit line, such as a global read bit line GRBL1 to GRBLM in FIG. 3, and is explained below.

Memory Array

Figure 3:
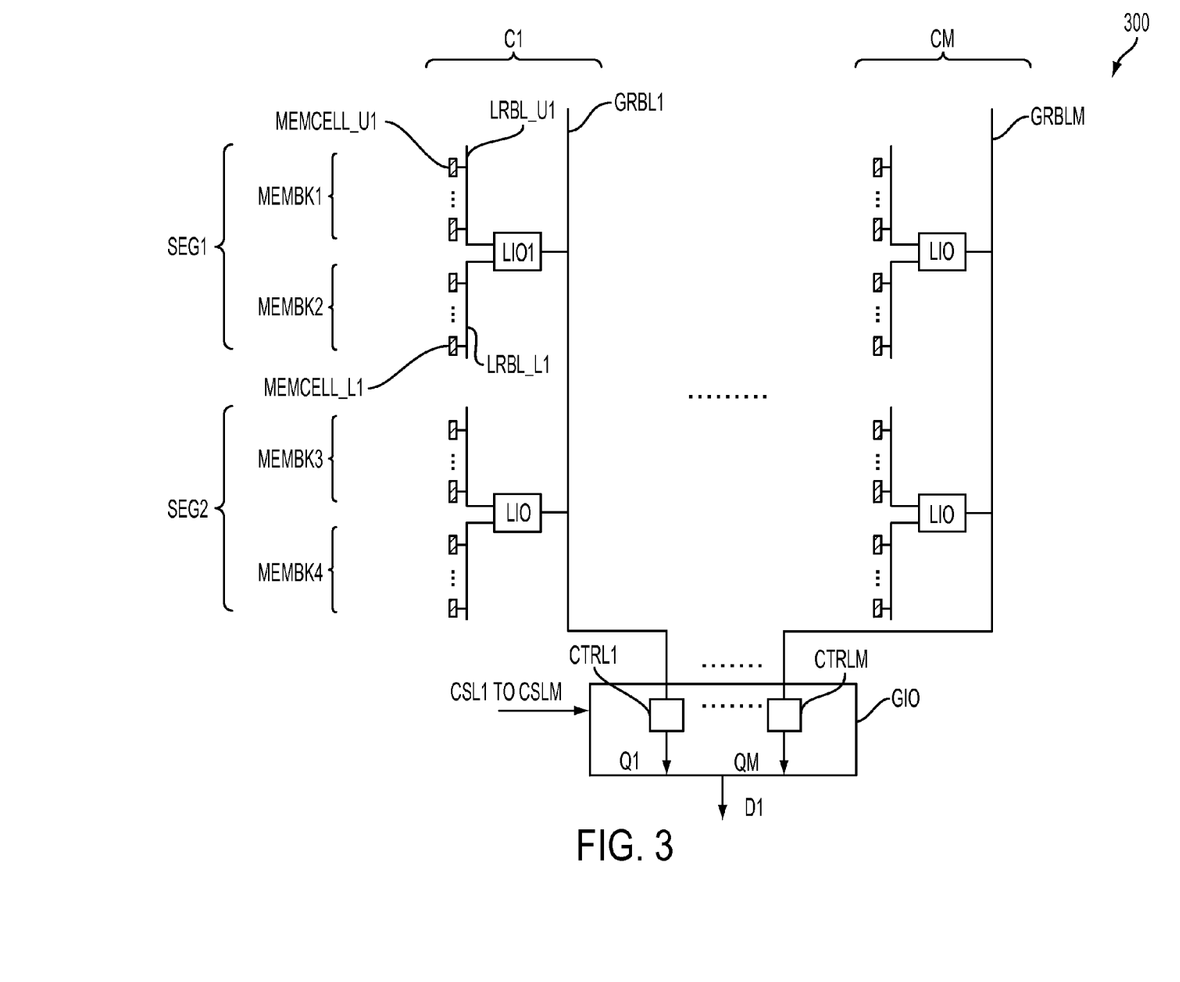
FIG. 3 is a diagram of a portion of a memory array of the memory macro in FIG. 1, in accordance with some embodiments.

FIG. 3 is a diagram of a portion 300 of memory array 138 in FIG. 1, in accordance with some embodiments. Memory array 138 includes a plurality of memory array portions 300.

Memory array portion 300 includes M columns labeled columns C1 to CM, wherein M is an integer number. For illustration, a column C1 to CM is called a column C. Each column C includes a plurality of local input-output LIOs corresponding to a plurality of segments. In the illustration of FIG. 3, memory array portion 300 includes two segments SEG1 and SEG2. Each of segments SEG1 and SEG2 in turn includes a local input-output LIO in a column C.

A local input-output (LIO) is coupled with two local read bit lines LRBL and a global read bit line GRBL. An LIO is also called a data circuit. For example, in FIG. 3, LIO1 of column C1 is coupled with two local read bit lines LRBL_U1 and LRBL_L1 and a global read bit line GRBL1. Each local read bit line LRBL, such as a local read bit line LRBL_U1 or LRBL_L1, is coupled with a plurality of memory cells MEMCELL and a local pre-charge circuit. For illustration, one memory cell MEMCELL_U1 coupled to read bit line LRBL_U1 and one memory cell MEM-CELL_L1 coupled to read bit line LRBL_L1 are labeled.

The local pre-charge circuits including transistors P410 and P420 are not shown in FIG. 3, but are shown and explained with reference to FIG. 4. Details of circuit connections between memory cell MEMCELL with local read bit line LRBL are described above with reference to FIG. 2. Memory cells MEMCELL coupled with the corresponding read bit line LRBL belong to a corresponding segment. For example, with reference to a column C, memory cells coupled with read bit line LRBL_U1 of segment SEG1 belong to memory bank MEMBK1. Memory cells coupled with read bit line LRBL_L1 of segment SEG1 belong to memory bank MEMBK2 of segment SGE1. Memory cells coupled with two read bit lines of segment SEG2 belong to memory banks MEMBK3 and MEMBK4, respectively, etc.

A plurality of global read bit lines, labeled GRBL1 to GRBLM, is coupled with a global input-output (GIO) circuit in FIG. 1. When the data stored in a memory cell is read, the data is reflected on corresponding local read bit line, local input-output LIO, and global read bit line. The data is then controlled by a corresponding control circuit CTRL1 to CTRLM to a corresponding output Q1 to QM, and is provided to circuits outside of memory macro 100 as a data line D1. In such a condition, when memory array 138 includes N memory portions 300, memory array 130 also includes N data lines from data line D1 to data line DN (not shown), wherein N is integer number. For example, as shown in FIG. 3, when the data stored in memory MEMCELL_U1 is read, the data is reflected on local read bit line LRBL_U1, local input-output LIO1, global read bit line GRBL1, and is transferred by control circuit CTRL1 to output Q1 and data line D1.

Global input-output (GIO) circuit receives global read lines GRBL1 to GRBLM corresponding to columns C1 to CM. GIO circuit is also called a data circuit. GIO circuit, based on a column select signal CSL1 to CSLM, selects one global read bit line out of the plurality of global read bit lines GRBL1 to GRBLM to transfer data on the selected global read bit line as data on a corresponding output Q1 to QM to be read. In some embodiments, data on multiples global read bit lines each from a circuit GIO is read at the same time. For example, each circuit GIO of the plurality of circuits GIO (not shown) selects data on global read bit line GRBL1 of column C1 for reading. For another example, each circuit GIO of the plurality of circuits GIO selects data on global read bit line GRBL2 of column C2 for reading, and each circuit GIO of the plurality of circuits GIO selects data on global read bit line GRBL3 of column C3 for reading, etc.

A control circuit CTRL1 to CTRLM is used to control the data on a corresponding global read bit line GRBL1 to GRBLM to an output Q1 to QM, respectively. For illustration, a control circuit CTRL1 to CTRLM is called a control circuit CTRL. Each of the data on output Q1 to QM is then selected as data on data line D1.

Memory array portion 300 having two segments SEG1 and SEG2 is for illustration. A different number of segments in a memory array portion 300 is within the scope of various embodiments.

LIO and GIO

Figure 4:
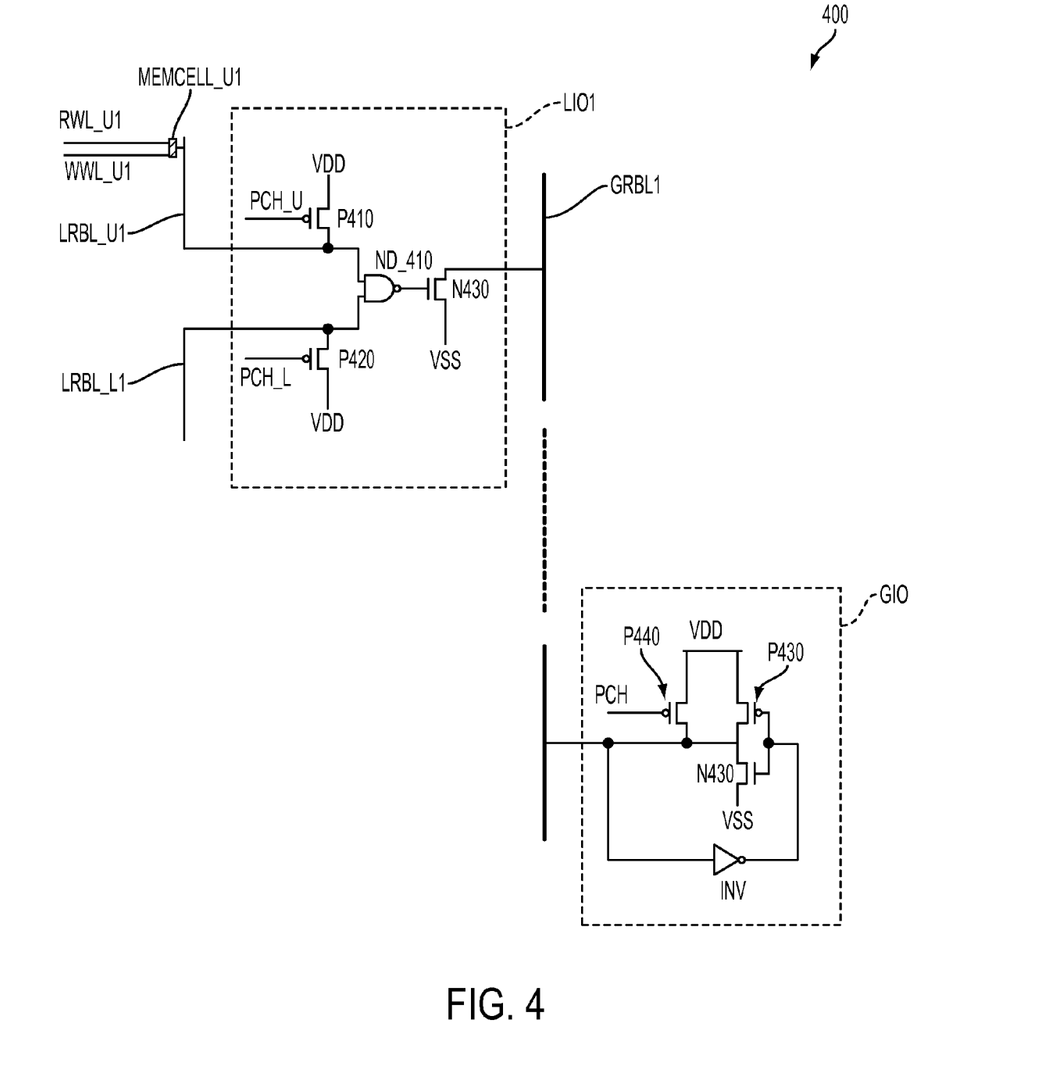
FIG. 4 is a diagram of a circuit that includes a local input-output (LIO) and a global input-output (GIO) of the memory array in FIG. 3, in accordance with some embodiments.

FIG. 4 is a diagram of a circuit 400, in accordance with some embodiments. Circuit 400 includes details of LIO1 and GIO in FIG. 3. In the illustration of FIG. 4, data from node ND shown in FIG. 2 of memory cell MEMCELL_U1 is read.

PMOS transistor P410 is to pre-charge read bit line LRBL_U1. For example, in the pre-charge mode, signal PCH_U is applied with a low logical value to turn on transistor P410. As a result, read bit line LRBL_U1 is pulled to a high logical value of supply voltage VDD at a source of transistor P410.

PMOS transistor P420 is to pre-charge read bit line LRBL_L1. For example, in the pre-charge mode, signal PCH_L is applied with a low logical value to turn on transistor P420. As a result, read bit line LRBL_L1 is pulled to a high logical value of supply voltage VDD at a source of transistor P420.

NAND gate ND_410 and transistor N430 operate to transfer a logical value of local read bit line LRBL_U1 or LRBL_L1 to global read bit line GRBL1. For example, when memory cell MEMCELL_U1 is being accessed, local read bit line LRBL_L1 is pre-charged to be logically high. When local read bit line LRBL_U1 is logically low, the output of NAND gate ND_410 is logically high. As a result, NMOS transistor N430 is turned on and pulls global read bit line GRBL1 to a low logical value of reference supply voltage VSS at the source of transistor N430. But if read bit line LRBL_U1 is logically high, global read bit line GRBL1 is also logically high. For example, in some embodiments, before a read operation, read bit lines LRBL_U1, LRBL_L1, and GRBL1 are pre-charged to a high logical value. When the low logical value from node ND of memory cell MEMCELL_U1 is read, read bit line LRBL_U1 stays at the pre-charged high logical value. Because both read bit lines LRBL_U1 and LBL_L1 are logically high, the output of NAND gate ND_410 is logically low. As a result, NMOS transistor N430 is turned off, and global read bit line GRBL1 remains at the pre-charged high logical value.

PMOS transistor P440 is used to pre-charge global read bit line GRBL1. For example, when signal PCH is applied with a low logical value, transistor P440 is turned on and pulls global read bit line GRBL1 to a high logical value of supply voltage VDD at the source of transistor P440.

Transistors P430, N430 and inverter INV operate to keep read bit line GRBL1 at a corresponding logical value. For illustration, read bit line GRBL1 reaches the high logical value. As a result, the output of inverter INV is logically low, which turns off transistor N430 and turn on transistor P430. As a result, read bit line GRBL1 is pulled to the high logical value of supply voltage VDD at the source of transistor P430. Effectively, read bit line GRBL1 is maintained at the high logical value. Conversely, when read bit line GRBL1 is logically low, the output of inverter INV is logically high, which turns off transistor P430 and turns on transistor N430. As a result, read bit line GRBL1 is pulled to the low logical value of reference supply voltage VSS at the source of transistor N430. Effectively, read bit line GRBL1 is maintained at the low logical value.

Operations related to local read bit line LRBL_L1 are similar to those of local read bit line LRBL_U1 wherein signal PCH_L and PMOS transistor P420 correspond to signal PCH_U and PMOS transistor P410, respectively.

In various embodiments, read bit lines LRBL_U1 and LRBL_L1 are coupled together. In such embodiments, an inverter replaces NAND gate ND_410 and receives one read bit line with one corresponding pre-charge circuit.

Waveforms

Figure 5:
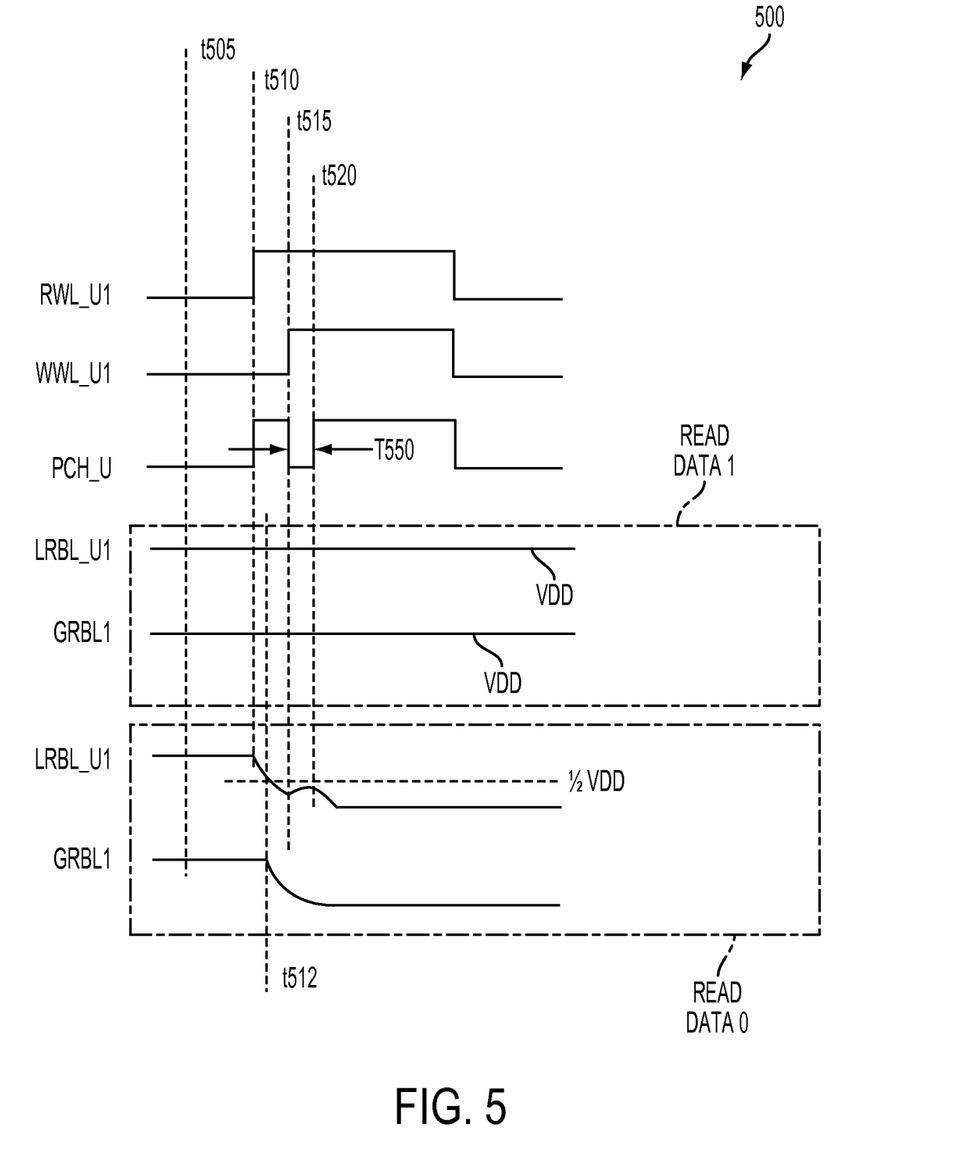
FIG. 5 is a graph of waveforms illustrating operations of the circuits in FIGS. 1 to 4, in accordance with some embodiments.

FIG. 5 is a graph of waveforms 500, in accordance with some embodiments. Waveforms 500 are used to illustrate operations of the circuits in FIGS. 1 to 4, including reading a low logical value ("Read data 0") and a high logical value ("Read data 1") of memory cell MEMCELL_U1 in FIG. 4.

At time t505, read word line RWL_U1 and write word line WWL_U1 are applied with a low logical value. Memory cell MEMCELL_U1 is therefore not read nor write accessed. Signal PCH_U is applied with a low logical value to turn on transistor P410 to charge read bit line LRBL_U1 to a high logical value at the source of transistor P410. GRBL1 is also pre-charged to a high logical value with transistor P440 being on.

At time t510, signal PCH_U is applied with a high logical value to turn off transistor P410 and electrically disconnects supply voltage VDD from read bit line LRBL_U1. Further, read word line RWL_U1 is applied with a high logical value to turn on transistor N22. Memory cell MEMCELL_U1 is thus read accessed. For illustration, node ND of memory cell MEMCELL_U1 stores a low logical value. As a result, detecting a logical value at read bit line LRBL_U1 and global read bit line GRBL1 reveals a high logical value, for a reading data of a high logical value or data "1." Because node ND is logically low, transistor N21 is turned off, and read bit line LRBL_U1 stays at the pre-charged high logical value.

At time t515, for illustration, memory cell MEMCELL_U1 is also write accessed. As a result, write word line WWL_U1 is applied with a high logical value. Further, signal PCH_U is applied with a low logical value to turn on transistor P410. As a result, read bit line LRBL_U1 is pulled to supply voltage VDD at the source of transistor P410. Effectively, read bit line LRBL_U1 continues to be logically high.

At time t520, signal PCH_U is applied with a high logical value to turn off transistor P410 to electrically disconnect read bit line LRBL_U1 from supply voltage VDD.

With reference to global read bit line GRBL1, during time periods with reference to times t510, t515, and t520, because read bit lines LRBL_U1 and LRBL_L1 are logically high, the output of NAND gate ND_410 is logically low and transistor N430 is turned off. As a result, global read bit line GRBL1 remains at the pre-charged high logical value.

Various embodiments of the present disclosure are advantageous over other approaches. For example, during time period T550 between time t515 and time t520, various embodiments avoid a write disturb caused by the write operation when write word line WWL_U1 is activated with a high logical value at time t515. Because write word line WWL_U1 is logically high, transistor PG10 is turned on, and the high logical value from write bit line WBL of memory cell MEMCELL_U1 is transferred to node ND, causing transistor N21 to turn on. Because transistor N21 is turned on, transistor N21 tends to pull read bit line LRBL_U1 towards reference supply voltage VSS at the source of transistor N21. However, during time period T550, transistor P410 is turned on and pulls read bit line LRBL_U1 to supply voltage VDD as explained above. As a result, read bit line LRBL_U1 remains at supply voltage VDD, and is not disturbed by the write operation. In contrast, in other approaches, during time period T550, transistor P410 is turned off and electrically disconnects read bit line LRBL_U1 from supply voltage VDD at the source of transistor P410. As such, in other approaches, when transistor N21 is turned on, transistor N21 causes read bit line LRBL_U1 to be pulled towards reference supply voltage VSS at the source of transistor N21, which, in various situations, changes the high logical value of read bit line LRBL_U1, or disturbs the read operation.

For illustration, at time t510, node ND stores a logical high value, and reading data is called reading a low logical value or reading data "0." Because node ND is logically high, transistor N21 is turned on, and pulls read bit line LRBL_U1 towards a low logical value. At time t515, when transistor P410 is turned on, there is a contention between transistor P410 and transistor N21 because transistor P410 tends to pull read bit line LRBL to supply voltage VDD while transistor N21 tends to pull read bit line LRBL_U1 to reference supply voltage VSS. As a result, after time t515, read bit line LRBL_U1 increases towards supply voltage VDD at the source of transistor P410. At time t520, when transistor P410 is turned off, the contention no longer exists, and read bit line LRBL_U1 is pulled to reference supply voltage VSS at the source of transistor N21.

With reference to global read bit line GRBL1, at time t512, read bit line LRBL_U1 reaches the threshold of NAND gate ND_410, which, for illustration is ½ VDD. As a result, the output of NAND gate ND_410 is logically high, and transistor N430 is turned on. Global read bit line GRBL1 is pulled towards a low logical value of reference supply voltage VSS at the source of transistor N430.

Signal PCH_U

Figure 7:
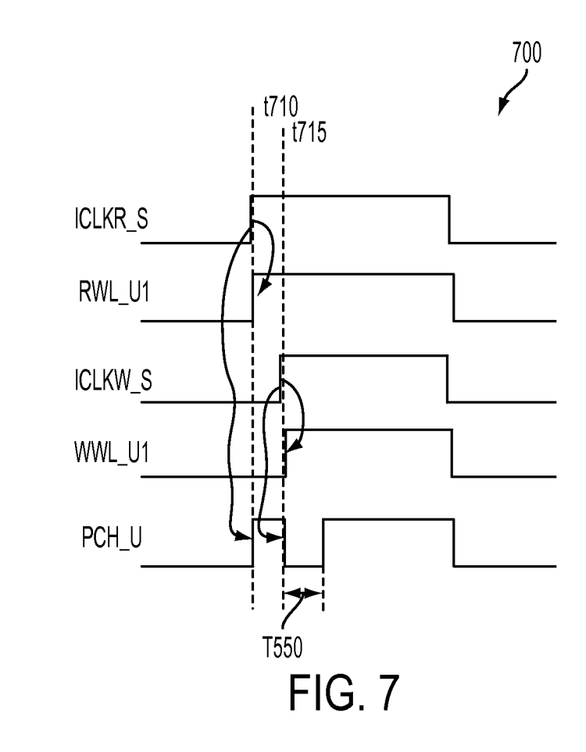
FIG. 7 is a graph of waveforms illustrating operations of the circuit in FIG. 6, in accordance with some embodiments.

FIG. 6 is a diagram of a circuit 600, in accordance with some embodiments. Circuit 600 is used to generate signal PCH_U. FIG. 7 is a graph of waveforms illustrating operations of circuit 600, in accordance with some embodiments.

Time t710 and time t715 correspond to time t510 and time t515 in FIG. 5, respectively. For simplicity, a rising edge of signal ICLKR_S occurs at time t710, and a rising edge of signal ICLKW_S occurs at time t715. At time t710, based on a rising edge of signal ICLKR_S, a rising edge of read word line RWL_U1 and of signal PCH_U is generated. At time t715, based on a rising edge of signal ICLKW_S, a rising edge of write word line WWL_U1 and a falling edge of signal PCH_U are generated.

Circuit DLGC inverts signal ICLKW_S to generate signal ICLKWB_S. In some embodiments, signal ICLKWB_S is an inverse logic of signal ICLKW_S for a time period T550. Signal DCTRL controls the time delay for signal ICLKW_S to be inverted, which, effectively, is the time for signal ICLKWB_S to be logically low. In some embodiments, time period T550 is adjusted based on signal DCTRL.

During time period between time t710 and time t715, signal ICLKW_S is logically low, which, by operation of NAND gate ND_620, results in signal ICLKWBD_S being logically high. Because signal ICLKR_S and signal ICLKWBD_S are logically high, by operation of AND gate AN_610, signal PCH_U is logically high between time t710 and time t715.

During time period T550, by operation of delay logic DLGC, signal ICLKWB_S is logically low. As a result, by operation of AND gate AN_610, signal PCH_U is also logically low.

In some embodiments, time period T550 or the duration of the negative pulse of signal PCH_U is designed such that during a read operation of data 0 in FIG. 5, transistor P410 is turned off before read bit line LRBL_U1 reaches a predetermined value, for various operational conditions. For example, if read bit line LRBL_U1 reaches beyond the predetermined value of ½ VDD, for example, the data on read bit line LRBL_U1 is considered logically high, and is no longer valid for a reading of data 0.

In some embodiments regarding a method, in response to a write operation to a memory cell that causes a data line of the memory cell to have a first voltage direction, causing the data line to have a second voltage direction opposite the first voltage direction.

In some embodiments, a circuit comprises a memory cell, a charging circuit, and a pulse generating circuit. The memory cell has a control line and a data line. The charging circuit is coupled with the data line and the pulse generating circuit. The pulse generating circuit is configured to generate a pulse of a signal to control the charging circuit at a time corresponding to an activation of the control line.

In some embodiments, a circuit comprises a memory cell and a second-type transistor. The memory cell includes a storage node, a write port, and a read port having a data line and a first-type transistor. The second-type transistor is configured to cause a voltage level at the data line towards a first supply voltage at a terminal of the second-type transistor in response to a) the write port writing data to the node and b) the read port causing the voltage level at the data line towards a second supply voltage at a terminal of the first-type transistor.

In some embodiments regarding a method that is based on a memory cell having a read data line, a read control line, and a write control line, a voltage level at the read data line is caused towards a first voltage value. The causing the voltage level at the read data line towards the first voltage value is stopped, and a read control line is activated to read data from the memory cell. The write control line is activated. In response to the write control line being activated, the voltage level at the read data line is caused towards the first voltage value for a predetermined time period.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor is configured as a drain, and a drain is configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A method comprising:
   in response to a write operation of a first logic state to a memory cell that causes a data line of the memory cell to have a first voltage direction, wherein the first voltage direction is opposite a voltage direction toward a voltage level of the first logic state, causing the data line to have a second voltage direction opposite the first voltage direction before a voltage level at the data line is equal to or beyond a second logic state threshold voltage level.

2. The method of claim 1, wherein the causing the data line to have the first voltage direction comprises turning on a transistor coupled with the data line.

3. The method of claim 1, wherein
   the causing the data line to have the first voltage direction comprises using a signal pulse to turn on a transistor coupled with the data line; and
   the transistor is used to charge the data line for a read operation of the memory cell.

4. The method of claim 1, wherein
   the memory cell includes a read port and a write port; and
   the data line is part of the read port of the memory cell.

5. The method of claim 1, wherein
   the memory cell comprises a write control line controlling a passgate;
   the passgate is coupled with a storage node of the memory cell; and
   data on the storage node affects a logical value on the data line.

6. The method of claim 1, wherein
   the first voltage direction is towards a supply voltage; and
   the second voltage direction is towards a reference supply voltage.

7. The method of claim 1, wherein
   the write operation to the memory cell comprises
      activating a write control signal of the memory cell to turn on a transistor; and
      transferring data through the transistor to a node of the memory cell.

8. A circuit comprising:
   a memory cell having a write control line and a data line;
   a charging circuit; and
   a pulse generating circuit,
   wherein
      the charging circuit is coupled with the data line and the pulse generating circuit;
      the pulse generating circuit is configured to generate a pulse of a signal to control the charging circuit at a time corresponding to an activation of the write control line for a write operation;
      the data line is caused to have a first voltage direction; and
      the charging circuit is configured to cause the data line to have a second voltage direction different from the first voltage direction based on the pulse.

9. The circuit of claim 8, wherein the charging circuit comprises a P-type transistor configured to receive the pulse at a gate of the P-type transistor.

10. The circuit of claim 8, wherein the write control line is configured to be activated.

11. The circuit of claim 8, wherein the pulse generating circuit is configured to generate the pulse of the signal based on an activation of a read operation of the memory cell and an activation of a write operation of the memory cell.

12. The circuit of claim 8, wherein the pulse generating circuit is configured to generate a width of the pulse based on reading a low logical value on the data line.

13. The circuit of claim 8, wherein the pulse generating circuit is configured to generate a width of the pulse based on a predetermined value of the data line during reading a low logical value on the data line.

14. A circuit comprising:
   a memory cell including
      a storage node;
      a write port; and
      a read port having a data line and a first-type transistor; and
   a second-type transistor;
   wherein
      the second-type transistor is configured to respond to a charge pulse having a pulse width, wherein the second-type transistor is responsive to a leading edge of the charge pulse to cause a voltage level at the data line towards a first supply voltage at a terminal of the second-type transistor, in response to the write port writing data to the storage node and the read port causing the voltage level at the data line towards a second supply voltage at a terminal of the first-type transistor, and wherein the second-type transistor is configured to be responsive to the pulse width to prevent the voltage level at the data line from exceeding a threshold voltage, wherein the threshold voltage is between the first supply voltage and the second supply voltage.

15. The circuit of claim 14, wherein
the first-type transistor includes an N-type transistor; and
the second type-transistor includes a P-type transistor.

16. The circuit of claim 14, wherein
the write port has a write control line coupled to a passgate;
the passgate is coupled to the storage node;
the storage node is coupled to a gate of the first-type transistor; and
the data line is coupled to another terminal of the first-type transistor.

17. The circuit of claim 14, wherein
the second-type transistor includes a P-type transistor; and
the P-type transistor is configured to receive a negative pulse at a gate of the P-type transistor to cause the voltage level at the data line to be pulled toward the supply voltage at the source of the P-type transistor during a time period of the negative pulse.

18. The circuit of claim 17 wherein
the circuit comprises a pulse generating circuit; and
the pulse generating circuit is configured to generate a width of the negative pulse based on a read activation of the read port and a write activation of the write port.

19. A method comprising:
based on a memory cell having a read data line, a read control line, and a write control line
   causing a voltage level at the read data line towards a first voltage value;
   stop causing the voltage level at the read data line towards the first voltage value and activating a read control line to read data from the memory cell;
   activating the write control line; and
   in response to the activating the write control line, causing the voltage level at the read data line towards a second voltage value for a predetermined time period and causing contention at the read data line between a first voltage source and a second voltage source.

20. The method of claim 19, comprising
causing the voltage level at the read data line towards the second voltage value for the predetermined time period by generating a width of a signal pulse based on a predetermined value of the data line during reading a low logical value on the read data line; and
applying the signal pulse to a gate of a transistor coupled to the read data line.

\* \* \* \* \*